(12) United States Patent  
Tredwell

(10) Patent No.: US 8,405,036 B2
(45) Date of Patent: Mar. 26, 2013

(54) DIGITAL RADIOGRAPHY IMAGER WITH BURIED INTERCONNECT LAYER IN SILICON-ON-GLASS AND METHOD OF FABRICATING SAME

(75) Inventor: Timothy J. Tredwell, Fairport, NY (US)

(73) Assignee: Carestream Health, Inc., Rochester, NY (US)

( * ) Notice: Subject to any disclaimer, the term of this patent is extended or adjusted under 35 U.S.C. 154(b) by 221 days.

(21) Appl. No.: 12/862,204

(22) Filed: Aug. 24, 2010

(65) Prior Publication Data

US 2012/0049076 A1    Mar. 1, 2012

(51) Int. Cl.
 *G01T 1/24* (2006.01)
(52) U.S. Cl. .................................. 250/370.08
(58) Field of Classification Search .............. 250/370.08
See application file for complete search history.

(56) References Cited

U.S. PATENT DOCUMENTS

| | | |
|---|---|---|
| 4,847,210 A | 7/1989 | Hwang et al. |
| 5,414,276 A | 5/1995 | McCarthy |
| 5,430,298 A | 7/1995 | Possin et al. |
| 5,463,238 A | 10/1995 | Takahashi et al. |
| 5,488,012 A | 1/1996 | McCarthy |
| 6,465,846 B1 | 10/2002 | Osanai |
| 6,583,030 B1 | 6/2003 | Grassi |
| 6,610,582 B1 | 8/2003 | Stewart |
| 6,649,977 B1 | 11/2003 | McCarthy |
| 6,759,282 B2 | 7/2004 | Campbell et al. |
| 6,921,961 B2 | 7/2005 | Sanchez et al. |
| 7,075,501 B1 | 7/2006 | Spitzer et al. |
| 7,122,442 B2 | 10/2006 | Cleavelin |
| 7,176,528 B2 | 2/2007 | Couillard et al. |
| 7,192,844 B2 | 3/2007 | Couillard et al. |
| 7,208,810 B2 | 4/2007 | Wright |
| 7,268,051 B2 | 9/2007 | Couillard et al. |
| 7,285,477 B1 | 10/2007 | Bernstein et al. |
| 7,948,017 B2 * | 5/2011 | Tredwell et al. ............. 257/292 |
| 2004/0061176 A1 | 4/2004 | Takafuji et al. |
| 2009/0186464 A1 | 7/2009 | Morimoto et al. |
| 2011/0147602 A1* | 6/2011 | Ishida et al. ............. 250/370.11 |

* cited by examiner

*Primary Examiner* — David Porta
*Assistant Examiner* — Hugh H Maupin

(57) ABSTRACT

A method embodiment for forming an imaging array includes providing a glass substrate having a top surface, forming a patterned conductive layer on the top surface of the glass substrate, and forming an insulating layer on the patterned conductive layer on a side of the patterned conductive layer opposite the glass substrate. The method can include providing a single crystal silicon substrate having an internal separation layer proximate a first surface of the single crystal silicon substrate. The single crystal silicon substrate is secured to the glass substrate such that the first surface of the single crystal silicon substrate corresponds to the insulating layer. The single crystal silicon substrate is separated at the internal separation layer to create an exposed surface opposite the first surface of the single crystal silicon substrate and an array including one or more photosensitive elements and/or readout elements is formed thereon.

20 Claims, 7 Drawing Sheets

DIGITAL RADIOGRAPHY IMAGER WITH BURIED INTERCONNECT LAYER IN SILICON-ON-GLASS AND METHOD OF FABRICATING SAME

TECHNICAL FIELD

The present invention relates to imaging arrays on insulating substrates. More specifically, the invention relates to an imaging array for use in a large area flat panel digital radiography imaging sensor formed using single-crystal silicon on glass and having one or more buried interconnect layers formed on the glass substrate prior to attachment of the silicon wafer to the glass substrate.

DESCRIPTION OF RELATED ART

Image sensors fabricated in single-crystal silicon and from deposited semiconductors, such as amorphous or polycrystalline silicon, are well known.

Image sensor arrays fabricated in single-crystal silicon generally include a photosensitive element, a readout circuit and several layers of metal interconnect. Examples of photosensitive elements include p-n junction photodiodes, metal-insulator-semiconductor photo-capacitors, charge coupled devices, phototransistors, and pinned photodiodes. Examples of readout circuits include charge-coupled devices, passive pixel readout circuits (typically with one transistor) and active pixel readout circuits (typically with three or more transistors per pixel). Examples of interconnects used in image sensors include bias lines, address lines and signal readout lines. Prior art image sensors in single-crystal silicon add layers of interconnect through successive deposition and patterning of conductive layers, such as metals, metal silicides, or doped polysilicon. These interconnect layers are used for functions such as bias supply, clock lines, data lines and grounds. The interconnect layers are generally opaque, and since they are generally routed over the photosensor, the fill factor of the photosensor in the pixel is greatly reduced, to generally less than 25%. In image sensors used in systems with optical image projection, such as digital cameras and camcorders, a micro-lenslett array fabricated on the image sensor allows light to be focused onto the photosensitive area in each pixel. However, for image sensors used in indirect digital radiography, the image sensor is in direct contact with the scintillator which converts incident X-rays to visible light photons. Lensletts do not provide any improvement in light collection efficiency for imaging arrays in contact with a scintillator.

FIG. 1 illustrates a circuit diagram for a conventional pixel design for an image sensor in single-crystal silicon. Each pixel 10 includes a photodiode 12, a transfer gate transistor 14, an amplifier transistor 16 that converts the voltage on one terminal of the photosensor to a current, a reset transistor 18 that restores the bias voltage on the photodiode 12, and a row-select transistor 20. The interconnect between the pixels includes six lines, namely, a row select line 22, a reset gate line 24, and a transfer gate line 26, arranged horizontally, and a data line 28 for signal readout, a voltage supply line 30, and a bias line 32, arranged vertically. This conventional interconnect structure is generally formed in two or more conductive layers, for example, with the horizontally-oriented lines in a first level of metal and the vertically-oriented lines in a second level of metal. As noted above, the interconnect forms a substantial portion of the pixel area, and when formed on top of the photosensitive layer, as in conventional arrays, the fill factor of the pixel is significantly reduced.

Image sensors fabricated from deposited semiconductors, such as amorphous silicon deposited on glass substrates, are formed by deposition of thin films of metals, insulating materials, and semiconductor materials. Since the semiconductor is deposited as one step in the overall process, the interconnects can be below and/or above the semiconductor materials. For amorphous silicon processes, at least one layer of interconnect is above the semiconductor layer. For polysilicon processes, several metal layers are disposed above the semiconductor layer. Again, because the interconnects are opaque, fill factor of the photosensor is reduced. In addition, because of the need to maximize fill-factor and to minimize topography, the width and thickness of the interconnects is limited, resulting in high-resistance power, addressing and readout.

Thus, there is a need in the art for an image sensing device in which the impact of the interconnect dimensions on fill factor is reduced or minimized. There also is a need in the art for an image sensing device having an interconnect with lowered capacitance and resistance.

SUMMARY OF THE INVENTION

The present invention relates to an improved image sensing device that can address such foregoing needs in the art and/or provide various advantages described herein.

In a first aspect, the present invention relates to a method of forming an imaging array. The method includes providing a glass substrate having a top surface, forming a patterned conductive layer on the top surface of the glass substrate, and forming an insulating layer on the patterned conductive layer on a side of the patterned conductive layer opposite the glass substrate. The method also includes providing a single crystal silicon substrate having an internal separation layer proximate a first surface of the single crystal silicon substrate. The single crystal silicon substrate is secured to the glass substrate such that the first surface of the single crystal silicon substrate is arranged proximate the insulating layer. The single crystal silicon substrate is separated at the internal separation layer to create an exposed surface opposite the first surface of the single crystal silicon substrate and an array comprising a plurality of photosensitive elements and readout elements is formed on the exposed surface. The photosensitive elements and the patterned conductive layer can be electrically coupled.

In another aspect, the present invention provides a method of forming an imaging apparatus that includes providing a glass substrate having a top surface; forming an optional base insulating layer on the top surface of the glass substrate; forming a first patterned conductive layer on the base insulating layer, on a side of the base insulating layer opposite the top surface of the glass substrate; forming an intermediate insulating layer on the patterned conductive layer, on a side of the first patterned conductive layer opposite the base insulating layer; forming a second patterned conductive layer on the intermediate insulating layer, on a side of the intermediate insulating layer opposite the first patterned conductive layer; and forming a top insulating layer on the second patterned conductive layer, on a side of the second patterned conductive layer opposite the intermediate insulating layer. The method also includes providing a single crystal silicon substrate having an internal separation layer proximate a first surface of the single crystal silicon substrate and bonding the single crystal silicon substrate to the glass substrate, with the top of the single crystal silicon substrate arranged proximate the top insulating layer, on a side of the top insulating layer opposite the second patterned conductive layer. The single crystal silicon substrate is separated at the internal separation layer to create an exposed surface opposite the first surface of the single crystal silicon substrate and an array of pixels is formed on the exposed surface, each pixel comprising a at least one photosensitive element and at least one readout element. The at least one photosensitive elements and the patterned conductive layers can be electrically coupled.

In another aspect, the present invention provides an imaging array including a glass substrate, a first insulating layer formed on a top surface of the glass substrate, a first patterned conductive layer formed on the first insulating layer, a second insulating layer formed on the first patterned conductive layer, on a side of the first patterned conductive layer opposite the first insulating layer, a dielectric formed on the second insulating layer, on a side of the second insulating layer opposite the first patterned conductive layer, a patterned single crystal silicon layer having a thickness of less than about 5 microns secured to the second insulating layer, on a side of the second insulating layer opposite the first patterned conductive layer, and an array of pixels including the patterned single crystal silicon layer, each pixel comprising a photosensitive element and a readout element.

These and other aspects, objects, and features of the invention may be appreciated with reference to the accompanying detailed description of the invention and Figures, which describe and illustrate preferred embodiments of the present invention.

DETAILED DESCRIPTION OF EXEMPLARY EMBODIMENTS

As noted above, the present invention relates to an improved image sensing device and a method of making such a device. The device preferably is a large area, e.g., approximately greater than 6 inches by 6 inches, flat panel digital radiography imaging sensor. The invention is not limited to this application, however, as the methodologies described below could be used in other applications. Preferred embodiments of the invention now will be described with reference to the Figures.

Figure 2:
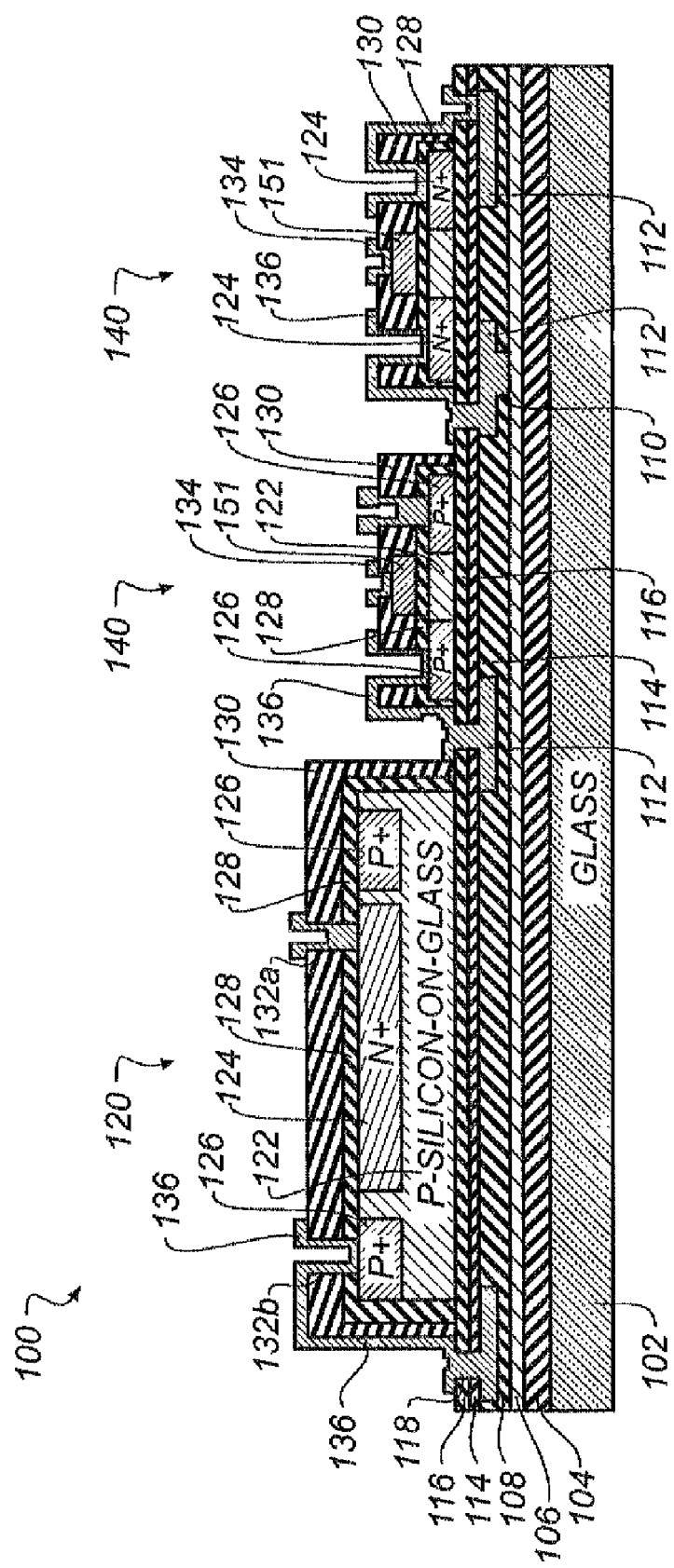
FIG. 2 is a cross-sectional view of an image sensing pixel according to an embodiment of the invention.

FIG. 2 is a cross-sectional view of a pixel 100 according to a preferred embodiment of the invention. The pixel 100 is one of multiple pixels in an array and is formed on a glass substrate 102. A first insulating layer 104, which is a dielectric, preferably formed from an inorganic insulating material such as silicon dioxide, is disposed on the glass substrate 102. The first insulating layer 104 can be optional. A first patterned conductive layer 106 is disposed on the first insulating layer 104. As will be described in more detail below, the first patterned conductive layer 106 preferably is a first global interconnect layer. A second insulating layer 108 is disposed on the first patterned conductive layer 106. The second insulating layer 108 is arranged to insulate the first patterned conductive layer 106 from subsequently formed layers, save through one or more vias 110. The vias 110 are formed through the second insulating layer 108 to allow access to the first patterned conductive layer 106 through the second insulating layer 108. As noted above, the first patterned conductive layer 106 preferably forms an interconnect, e.g., a plurality of lines for electrically connecting adjacent pixels, oriented substantially along the row direction of the image sensor. A second patterned conductive layer 112 is formed selectively on the second insulating layer 108. The second patterned conductive layer 112 preferably forms an interconnect oriented substantially in the column direction of the image sensor, e.g., substantially perpendicular to the interconnect comprising the first global metallization layer. A portion of the second patterned conductive layer 112 communicates with the first patterned conductive layer 106, through the vias 110. As will be appreciated, the arrangement of the present invention is not limited to the foregoing; the interconnect of the first patterned conductive layer 106 could be arranged in the columnar direction and the interconnect formed by the second patterned conductive layer 112 could be arranged in the row direction.

A third insulating layer 114 is formed on the second patterned conductive layer 112, to insulate the second patterned conductive layer 112 from subsequently formed layers. In addition, one or more dielectric layers 116 can be formed on the third insulating layer 114. The dielectric layers 116 can be optional. Further, the dielectric layers 116 can be formed of materials that facilitate wafer bonding, that provide encapsulation and/or that promote planarization. For example, in anodic bonding, the dielectric layers 116 can provide ions (e.g., calcium or Na), which can migrate through atomic layers to facilitate the anodic bond. For example, bonding processes in exemplary embodiments can produce or require impurities and the dielectric layers 116 can provide an encapsulation function to reduce or prevent such impurities from affecting device operation. Alternatively, or in addition for example, the dielectric layers 116 can provide a planarization function by either having a top surface mechanically polished or CMP, or spin coating planarization processes. Vias 118 can be formed through the third insulating layer 114 and the dielectric layers 116 to allow for electrical contact with the second patterned conductive layer 112.

Figure 3:
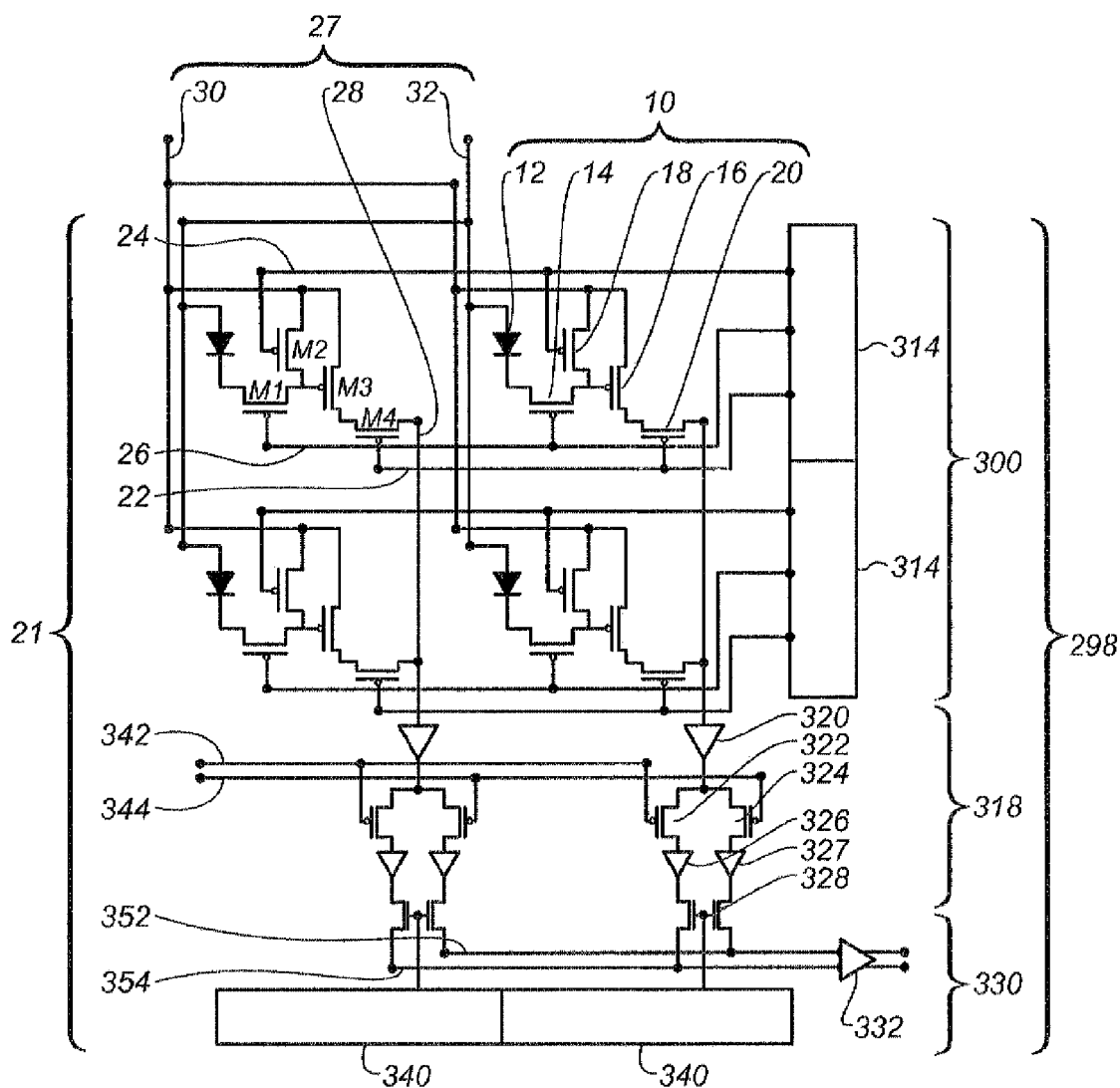
FIG. 3 is a circuit diagram illustrating an embodiment of an image sensing array according to the invention.

The first and second patterned conductive layers 106, 112 and alternating first, second, and third insulating layers 104, 108, and 114 formed on the glass substrate, form most, and in some embodiments all, of the global interconnect for the pixel array circuits. For example, in a preferred embodiment and referring to the circuit diagram of FIG. 3, the first patterned conductive layer forms a horizontal global interconnect 21, including the row select lines 22, the reset gate lines 24 and the transfer gate lines 26. The second patterned conductive layer forms a vertical global interconnect 27, including the data lines 28, the voltage supply lines 30, and the bias lines 32 which supply bias to the reset transistor 18 and the amplifier transistor 20. The intermediate insulating layers act to isolate the first and second patterned conductive layers 106, 112 from each other and from other components of the imaging array. Of course, the first and the second patterned conductive layers could alternately make up additional clock, bias and/or data lines comprising the interconnect. Additionally, the first and second patterned conductive layers can function as local interconnect, connecting circuit elements within the peripheral circuits or within the pixels.

In other embodiments, the invention could include more or less patterned conductive layers forming interconnects. For example, a single layer of global interconnect could be provided, with only a single patterned conductive layer between first and second insulating layers. In still other embodiments, additional interconnect layers could be included, each of the layers including both a conductive or metallization layer and an insulating layer separating the conductive or metallization layer from a previously or subsequently formed conductive or metallization layer.

Figure 1:
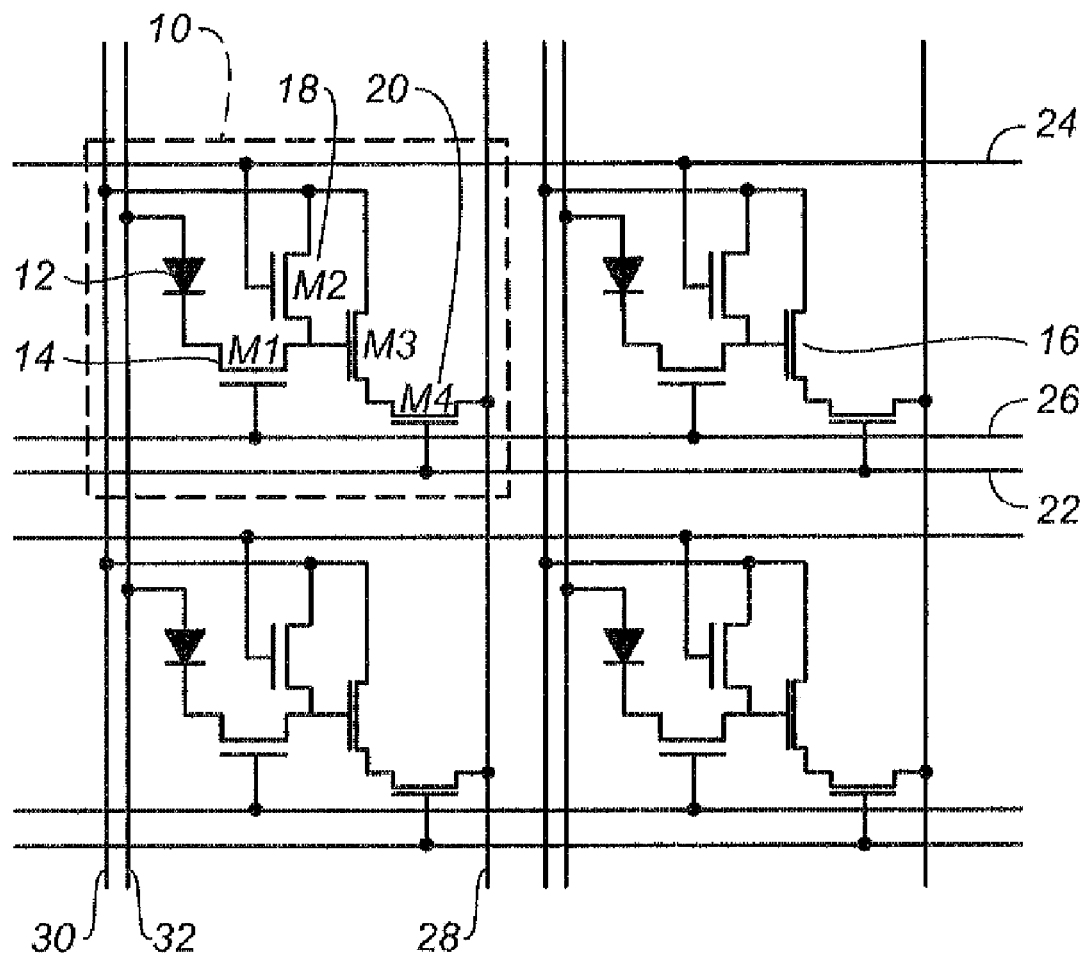
FIG. 1 is a circuit diagram for a conventional pixel structure used in imaging displays.

Referring again to FIG. 2, a photosensitive element 120 and transistors 140 (of which two are shown) are formed on the dielectric layer 116. In a preferred embodiment, more than two transistors 140 may be provided, with the transistors 140 have substantially the same functioning as one or more of the transistors 14, 16, 18, 20, illustrated in FIGS. 1 and 3. Additionally, the transistors 140 can be used to form peripheral circuitry 298.

The photosensor element 120 and transistor elements 140 include a layer of silicon 122 (e.g., p-doped single-crystal silicon in this arrangement) disposed on the dielectric layer 116. In the illustrated embodiment, the silicon layer for the photosensor element 120 and the silicon layer for the transistor element 140 are of different thicknesses. A fourth insulating layer 128 is disposed on the layer of silicon 122, and forms a gate insulator in the transistor elements 140. A third patterned conductive layer 134 forms a gate electrode 151 for the transistors. This third patterned conductive layer 134 also cooperates with a via (not shown) to contact the second patterned conductive layer 112 which in turn is connected through the vias 110 to the first patterned conductive layer 106.

Highly (e.g., P+) doped regions 126 (e.g., regions of silicon doped at a concentration of $>1\times10^{18}$ cm$^{-3}$ with p-type dopant such as boron) are formed proximate the upper surface of the silicon layer 122 in photosensor element 120 and are formed proximate the upper surface of the silicon layer 122 in one of the transistor elements 140. These regions form the body contact to the photosensor and the PMOS transistor source and drain. Highly (e.g., N+) doped regions 124 (e.g., regions of silicon doped at a concentration of $>1\times10^{18}$ cm$^{-3}$ with n-type dopant such as phosphorous or arsenic) are formed proximate the upper surface of the silicon layer 122 in photosensor element 120 and are formed proximate the upper surface of the silicon layer 122 in one of the transistor elements 140. Highly N+ and P+ doped regions form a p-n junction photodiode in the photosensor element 120.

A fifth insulating layer 130 is formed on the fourth insulating layer 128. This fifth insulating layer 130 comprises an inter-metal insulator. Vias 132a, 132b are formed through the fourth and fifth insulating layers 128, 130, providing electrical access to the N+ and P+ diffusion areas of the photosensor 120 and the transistors 140. A fourth patterned conductive layer 136 cooperates with the via 132a to provide electrical connection to the N+ doped regions 124, and with the vias 132b to provide electrical connection to the P+ doped regions 126. This fourth patterned conductive layer 136 also cooperates with the via 118 to provide an electrical connection between the P+ doped region 126 and the second patterned conductive layer 112 and between the N+ doped regions and the second patterned conductive layer 112. For selected bias and clock lines, the vias 110 can connect the second patterned conductive layer 112 to the first patterned conductive layer 106. In the preferred embodiment, the first and second patterned conductive layers 106, 112 are global interconnect layers and the third and fourth patterned conductive layers are local, e.g., intra-pixel, interconnect layers. In this manner, much of the global interconnect, that is, the connection between pixels, is done under the photosensors and transistors, and only the local interconnect is formed on the photosensors and transistors. As will be understood by one of ordinary skill in the art, such an arrangement can increase or greatly improve fill factor.

The function of the pixel 100 is similar to that of conventional pixels. As noted above, FIG. 3 is a circuit diagram showing a plurality of the pixels 100 and peripheral circuitry 298. As shown, each of the pixels 100 includes the photosensitive element 120 (a photodiode in the illustrated example) and transistors 140, which include the transfer gate transistor 14, amplifier transistor 16, reset transistor 18 and row select transistor 20. The pixels within each row are connected using the horizontal global interconnect lines 21. In the preferred embodiment, the horizontal global interconnect lines 21 are realized in the first patterned conductive layer 106. The pixels within each column are connected using the vertical global interconnect lines 27, which are realized in the second patterned conductive layer 112. In another embodiment, the first patterned conductive layer 106 could form the vertical global interconnect lines 27 and the second patterned conductive layer 112 could form the horizontal global interconnect lines 21.

The peripheral circuitry 298 includes vertical addressing circuitry 300 to control the horizontal global interconnect lines 21, horizontal addressing and signal output circuitry 330 to control the vertical global interconnect lines 27, and column amplification and sampling circuitry 318. The peripheral circuitry is preferably formed from PMOS transistors and/or from NMOS transistors similar to PMOS transistors, but with N+ source and drain diffusions in place of the P+ source and drain diffusions.

The vertical addressing circuitry includes vertical address register stages 314. The vertical address register stages 314 create clock signals for the timing of the reset, transfer and row-select operations in a row corresponding to the stage. When a particular row is not being addressed, the vertical address register stage 314 corresponding to that row holds the reset gate line 24, row select gate line 22 and transfer gate line 26 at a voltage that maintains their corresponding transistors in an "off", or non-conducting, state. When a particular row is being addressed, the vertical address register stage 314 corresponding to that row provides appropriate clock signals to the reset gate line 24, row select gate line 22 and transfer gate line 26. These clock signals first turn on (by switching to a conducting state) row select transistor 20, thereby connecting amplifier transistor 16 to column amplifiers 320. Briefly enabling clamp transistor 322 by addressing a clamp clock interconnect line 342 allows a clamp voltage corresponding to the voltage on the amplifier gate 16 to be held on the corresponding column clamp voltage amplifier 326. The vertical address register stage 314 then turns on the transfer gate line 26, turning on the transfer gate 14 in each pixel in the selected row. This allows the photo-generated charge on the photodiode to shift the voltage on the gate of the amplifier transistor 16 by an amount proportional to the photo-charge stored on the photodiode. This signal may be sampled by enabling sample gate 344, thereby enabling sample transistor 324 and storing the sample charge on the column signal voltage amplifier 327. Following storage of the clamp voltage and the signal voltage on amplifiers 326, 327, respectively, for all columns, the row readout in the horizontal direction is performed by the horizontal addressing and signal output circuitry 330, which includes horizontal address register stages 340, column signal select lines 328, and an output amplifier 332. As each horizontal address register stage 340 is addressed, the column signal select line 328 corresponding to that column is enabled, transferring the signal voltage stored on the clamp amplifier 326 and signal amplifier 328 to the horizontal signal line for signal voltage 352 and to the horizontal signal line for clamp voltage 354, respectively. The output amplifier 332 buffers the signal for driving clamp and signal voltages off-panel.

Exemplary embodiments according to the present invention are not limited to the illustrated photosensitive element and transistors. As will be appreciated, any photosensitive element could be used in conjunction with the invention, including, but not limited to, p-n junction photodiodes, metal-insulator-semiconductor photo-capacitors, charge coupled devices, phototransistors, and pinned photodiodes. In addition, the photosensitive elements can be formed in amorphous silicon. Also, the photosensitive elements can be selected from p-n junction photodiodes, PIN junction photodiodes, MIS sensors, avalanche photodiodes, photoconductors, and photo-transistors. Image sensors fabricated from deposited semiconductors, for example, amorphous or polycrystalline silicon, can be applied to applications requiring large image area, such as digital radiography.

In other embodiments, readout elements could be formed in the thin film silicon, as described above, and photosensitive elements such as amorphous silicon photosensitive elements could be formed on top of the readout elements, using known techniques. Such an arrangement could further increase or maximize fill factor, because only the photosensitive elements would be contained on the upper-most plane of the device. Other known transistors could also be used in place of the illustrated transistor, which is a thin-film transistor.

As noted above, in the first embodiment, circuits containing transistors formed in silicon-on-glass provide the vertical address circuitry 300, the horizontal address circuitry 330 and the column amplifier and sampling circuitry 318. Interconnect which spans the width of the imaging array, such as the clamp and sample clock interconnects 342 and 344, the horizontal signal lines 352 and 354, and clock and bias signals for the vertical address register stages 314 and the horizontal address register stages 340, also preferably are realized in the patterned conductive layers 106, 112, although they may be formed in other patterned conductive layers in other embodiments. Preferably, this interconnect is formed on the glass substrate 102 prior to attachment of the silicon wafer, from which the photosensors and transistors are formed, to the glass substrate 102. As will be appreciated, in relatively larger displays in which multiple silicon wafers are placed on a single glass substrate, a common electrical interconnect can be formed according to this invention without the need to later (e.g., after formation of the readout and photosensitive elements) electrically connect the wafers. The first and second patterned conductive layers span the entire apparatus, such that silicon wafers can be placed individually on the display, without concerns about forming and aligning a global interconnect between and among the wafers.

An exemplary method of manufacturing the pixel 100 illustrated in FIG. 2 now will be described with reference to FIGS. 4A-4I.

Figure 4A:
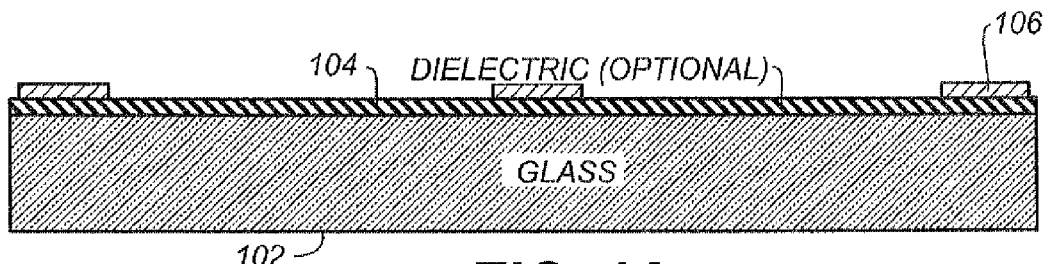
FIGS. 4A-4I are cross-section views illustrating an exemplary formation process embodiment for the image sensing pixel illustrated in FIG. 2.

In FIG. 4A, the glass substrate 102 is provided. The glass substrate 102 has a top surface and a bottom surface, and the first insulating layer 104 is formed on the top surface of the glass substrate 102. In this example, the first insulating layer 104 is silicon dioxide, and may be formed on the top surface of the glass substrate 102 using known techniques, such as by deposition, including chemical vapor deposition (CVD), sputter deposition or plating. Other insulators, including but not limited to silicon nitride, could alternatively be used in the present invention for the first insulating layer 104. As also illustrated in FIG. 4A, the first patterned conductive layer 106 is formed on the first insulating layer 104. The first patterned conductive layer 106 is defined lithographically to create portions or patterns that form the global interconnect for the array. In other applications, the first insulating layer 104 may not be used at all. In those embodiments, the first patterned conductive layer 106 can be formed directly on the glass substrate 102.

Figure 4B:
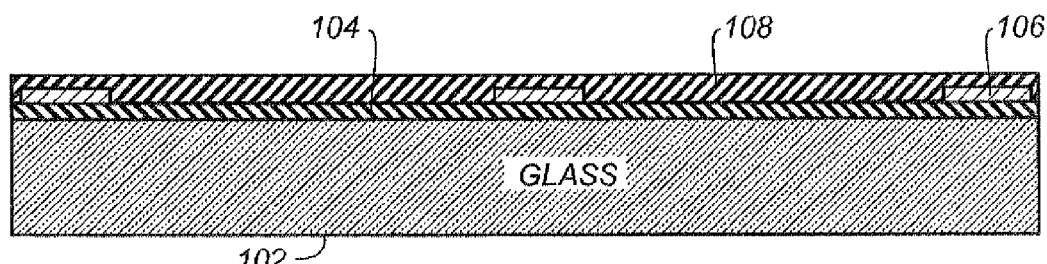
Figure 4C:
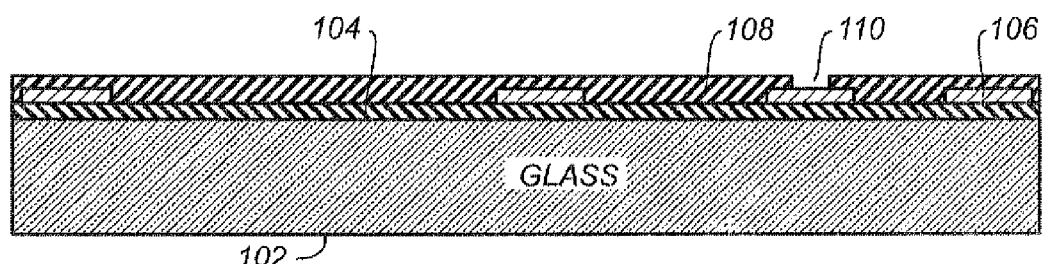

As illustrated in FIG. 4B, the second insulating layer 108 is formed or deposited on the first patterned conductive layer 106. The second insulating layer 108 may be the same as or different from the first insulating layer 104, and can be formed in any of the manners described above with respect to the first insulating layer 104. In FIG. 4C, the vias 110 are formed through the second insulating layer 108 to allow access to a portion of the first patterned conductive layer 106. In one embodiment, the via 110 can be formed at a position adjacent to the readout elements or the photosensitive elements. Known etching or other patterning techniques preferably are used to photolithographically define and form the via 110.

Figure 4D:
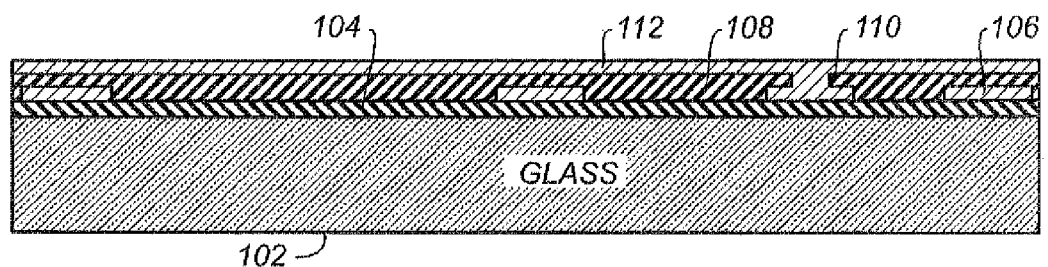
Figure 4E:
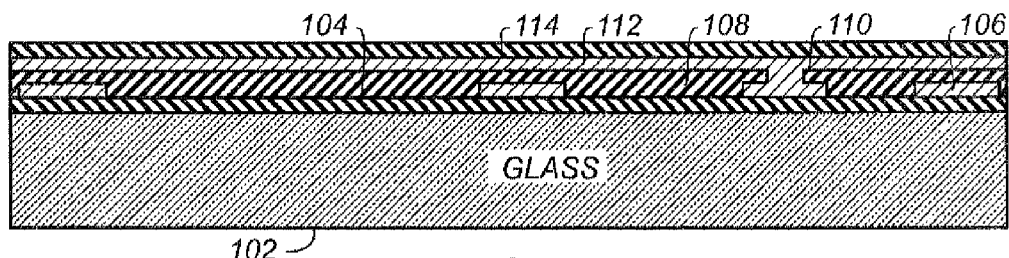

In FIG. 4D, the second patterned conductive layer 112 is formed on the second insulating layer 108. The second patterned conductive layer 112 may be patterned in any number of ways, according to the design of the imaging apparatus 100. In this embodiment, the second patterned conductive layer 112 can form at least a part of the global interconnect. To this end, the second patterned conductive layer 112 is deposited over the via 110, so as to be electrically connected to the first patterned conductive layer 106. The third insulating layer 114 thereafter is formed or deposited on the second patterned conductive layer 112, as illustrated in FIG. 4E. The third insulating layer 114 acts as a top insulating layer. The surface of the third insulating layer 114 may be planarized, such as with mechanical polishing, chemical-mechanical polishing (CMP) or by coating the third insulating layer with a planarizing material.

As will be appreciated, the structure of FIG. 4E is a glass substrate for use in an imaging apparatus with most, and in some cases, all global electrical interconnects for the entire array. Preferably, the glass substrate has length and width dimensions that will approximate the size of the imaging apparatus, which can be quite large. Pixels, each including a photosensitive element and a readout element, can then be formed on the glass substrate, above the first and second patterned conductive layers 106, 112. In one embodiment, these pixels need not be electrically connected to each other after formation, but only need be electrically connected to one or both of the underlying patterned conductive layers.

Figure 4F:
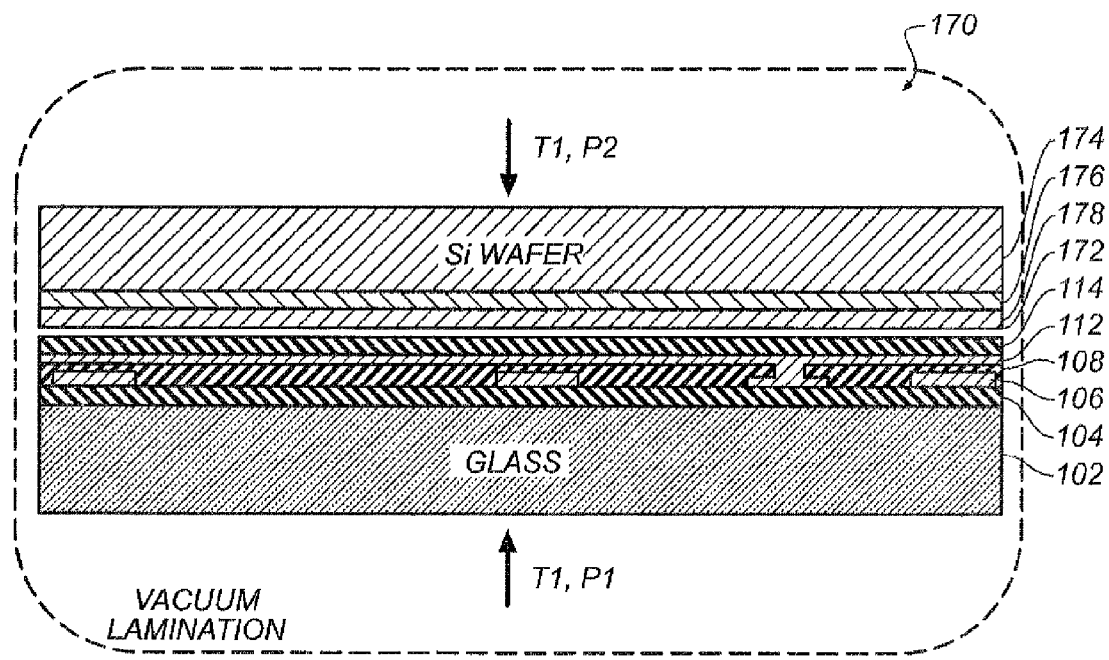

Formation of those pixels now will be described with reference to FIGS. 4F-4I. As shown in FIG. 4F, a silicon wafer 170 is provided. The silicon wafer 170 preferably is a single crystal silicon substrate and has a first surface 172 and a second surface 174, opposite the first surface 172. The third insulating layer 114 may be used in the attachment of the single crystal silicon substrate. A Hydrogen-implanted separation region 176 is arranged proximate the first surface 172, defining a thin region of silicon 178 between the Hydrogen-implanted separation region 176 and the first surface 172. A separation region 176 can be formed, for example, by implantation such as H, Si or O, A Hydrogen-implanted separation region 176 can be prepared as described in U.S. Pat. Nos. 7,176,528; 7,192,844; and 7,268,051 to form an internal separation layer and preferably is no greater than about 5 microns deep. That is, the thin region of silicon 178 is preferably no thicker than about 5 microns below the surface of the silicon (e.g., <1 micron).

As shown in FIG. 4F, the first surface 172 of the silicon wafer can be bonded to the third insulating layer 114 by an anodic bonding process. For example, the bonding can be done in the presence of heat and pressure, in a manner similar to that described in U.S. Pat. No. 7,176,528. The resultant anodic bond retains the silicon wafer 170 on the glass substrate 102, with the patterned conductive and insulating layers disposed therebetween. Other bonding techniques, including, but not limited to, fit bonding, soldering, and adhesives could alternatively be used to bond the silicon wafer to the glass substrate 102. In the case of frit bonding, for example, a bonding layer may be used that is comprised of particles ~0.1-1.0 micron in diameter formed of glass with lower softening temperature than the substrate 102. When soldering is used, a bonding layer comprised of a metal alloy with a melting temperature lower than that of the substrate is used to bond to the substrate. No anodic bond is formed when fit bonding or soldering is used. The type of bonding employed may vary based on the composition of the third insulating layer, or the application. However, anodic bonding has been found to be effective and can be used in embodiments according to the present invention.

Figure 4G:
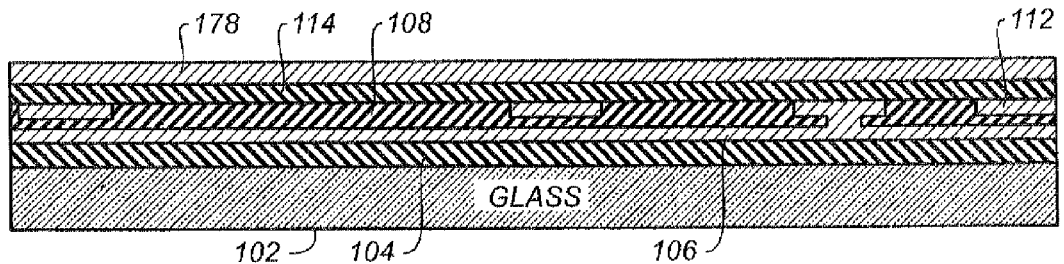
Figure 5:
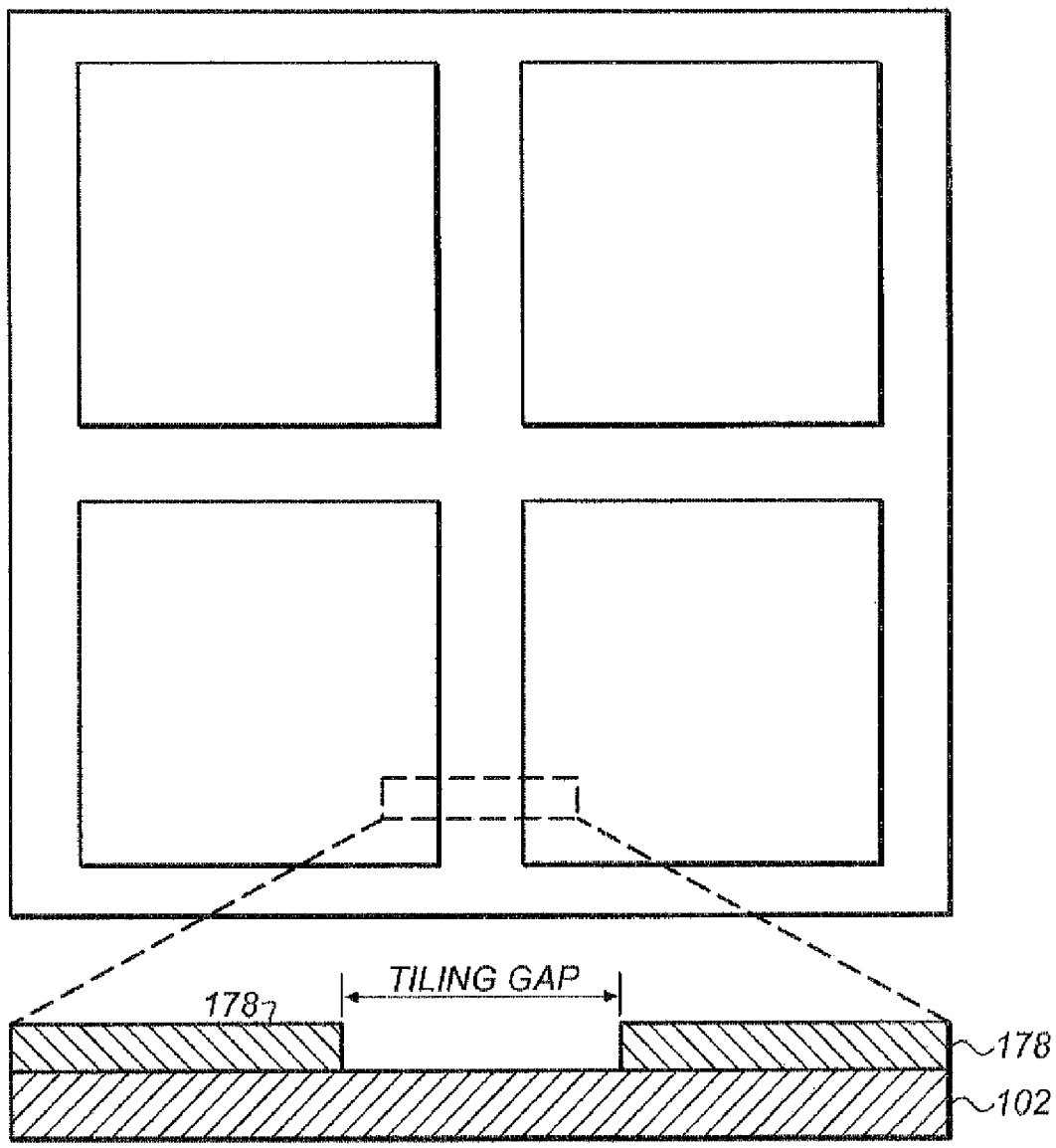
FIG. 5 is a diagram illustrating two views of a large area glass substrate having four silicon wafers attached thereto.

In the next step, illustrated in FIG. 4G, the silicon wafer is separated at the hydrogen-implanted separation region 176. More specifically, using known techniques, described, for example, in U.S. Pat. No. 7,176,528, the portion of the silicon wafer 170 on the side of the hydrogen-implanted separation region 176 closest the second surface 174 is removed. The thin region of silicon 178 is thereafter exposed and is all that remains of the silicon wafer 170. The exposed surface of this thin region of silicon 178 preferably also is polished, thereby removing regions of crystalline imperfection resulting from the hydrogen implant and the fracturing of the separation layer. FIG. 5 shows a top down illustration of a glass substrate 102 (370 mm×470 mm) with four silicon wafers 178 bonded thereto and polished in preparation for device fabrication.

Figure 4H:
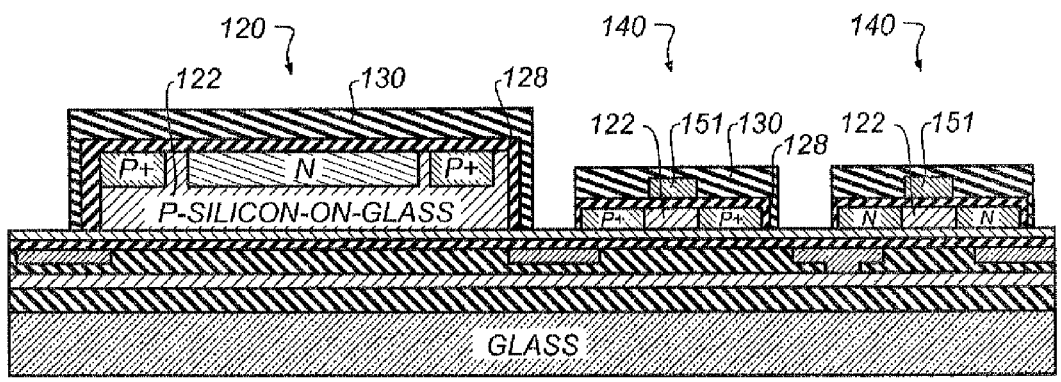

In FIG. 4H, the photosensors 120 and the transistors 140 are formed on the polished surface of the thin region of silicon 178. In one embodiment, the thin region of silicon 178 forms the silicon layer 122 of the photosensor 120 of the transistors 140. Known etching techniques preferably are used to create the patterning for the silicon layer 122. As illustrated, it may be desirable to thin out, relative to the photosensitive element, the portion of the thin region of silicon 178 used in the transistors. Exemplary remaining components of the photosensors 120 and the transistors 140 are described above and additional techniques for variously forming these components are known in the art and will not be described herein in further detail.

Figure 4I:
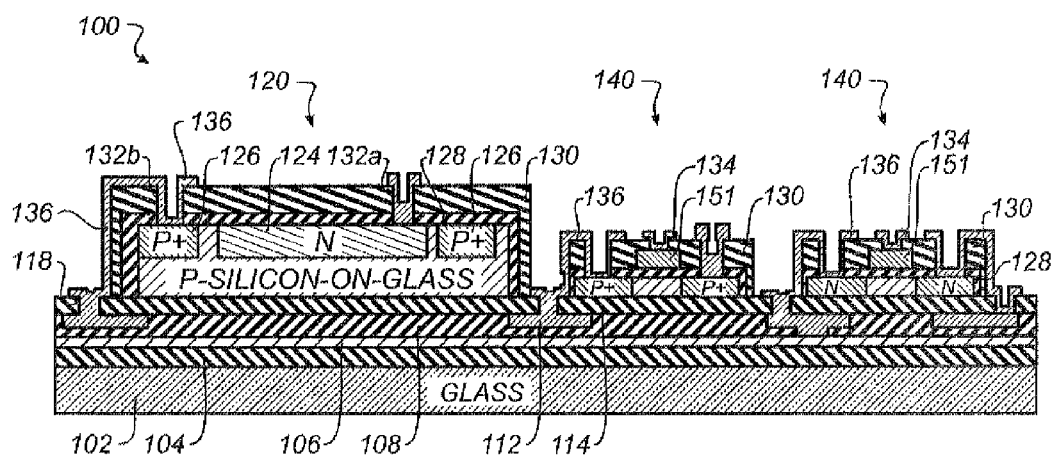

In FIG. 4I, interconnect is formed between the circuit elements formed on the polished surface of the thin region of silicon 178 and the patterned conductive layers 106, 112. For example, the vias 118, 132a, 132b are formed through the insulating layers at the top of the photosensors and transistors and to the second patterned conductive layer 112. The third and fourth patterned conductive layers 134, 136 then are formed, creating electrical interconnect between the circuit elements and the first patterned conductive layers.

As should be understood, an imager is formed by creating an array of the pixels on the glass substrate. The global interconnects at least partially embodied in the first and second patterned conductive layers are buried beneath the photosensors and the transistors, connecting the pixels. In embodiments for preferred applications, a number of silicon wafers or tiles are bonded to a single glass substrate, with each wafer or tile then being formed into photosensitive and readout elements, according to the methods described above. Regardless of the number of wafers required, or the number of pixels formed, the first and second patterned conductive layers are global interconnect for one or more tiles or for all pixels. In one embodiment, only local interconnects are needed to be formed in the individual photosensors 120, transistors 140 or pixels 100 because the global conductive connections (e.g., row, column, etc.) are made in the buried interconnect layers. At the periphery of the array, transistors or other elements preferably also are provided as the peripheral circuitry described in connection with FIG. 3. This peripheral circuitry preferably will include the first and second patterned conductive layers and other transistors and the like, which may be formed in the same manner as the pixels. Although the transistors in the peripheral circuitry may be substantially the same as the PMOS transistors described above, they may alternatively be NMOS transistors, in which N+ doped regions could be used as the source and drain regions or both NMOS and PMOS transistors. Fabrication of such elements is substantially the same as described above.

By fabricating the global interconnect layers on planes below the image sensor, the space required for the interconnect in the plane of the image sensor is greatly reduced. Specifically, the device can be fabricated such that the only space required for the global interconnect in the plane of the image sensor is that of a via hole. The via hole is typically on the order of about 4 microns by 4 microns, much smaller than the typical size of a signal line. Signal lines are typically about 8 microns wide and extend across the entire pixel, which likely is on the order of about 100 microns. This difference is particularly appreciated when multiple lines can be removed from above each pixel. Fill factor is greatly increased.

Burying the interconnect layers can also result in a lower capacitance for the interconnect. For instance, insulating layers can be made as thick as possible, because they are disposed below the image sensor. Increasing the thickness of the insulating layers reduces capacitance between other metal lines in adjacent interconnect planes. The distance between the first and second metallization layers can be increased to a distance that reduces or all but eliminates capacitance coupling between the layers. For example, thickness of the insulating layer in the preferred embodiment would be greater than 500 nm. Of course, selecting proper materials for the insulating layers, preferably those with low dielectric constant, such as silicon dioxide, can also reduce capacitive coupling between the metallization layers. By reducing the capacitance, circuit speed is improved, and circuit noise is reduced, and feedthrough between lines, such as between clock and data lines or between clock and bias lines, is lessened.

The pixel structure according to the preferred embodiment also results in lower resistance for the interconnect. As noted above, the insulating layers can be made as thick as possible, because they are disposed below the imaging sensor. This is also true for the metallization layers comprising the interconnect layers. In fact, the metallization layers can be made as thick and as wide as desired, to reduce resistance. The metallization layers would typically be comprised of aluminum in conjunction with thin films of other metals to act as barriers to metal diffusion or to reduce electro-migration. The thicknesses of these layers could be as great as 1,000 nm for low resistance. Similarly, the present techniques allow for fabrication of the metallization layers in materials such as copper, which inherently have lower resistivity. By decreasing the resistivity, circuit speed is improved, circuit noise is reduced, and feedthrough between lines, such as between clock and data lines or between clock and bias lines, is lessened.

The pixel structure of the invention also allows for a finer metal pitch, which is important for high density interconnect applications. Significantly narrower line widths in metal lines and smaller widths of vias are possible for lines and vias formed on silicon wafers as compared to conductive lines and vias formed using flat-panel process equipment used in the display manufacturing industry. Photolithography and etch equipment for silicon wafers can realize line widths from 45 nm to 1,000 nm routinely in production. Photolithography and etch equipment for flat-panel backplanes for display applications realizes line widths from 2,000 nm to 10,000 nm in production. As a result, the global interconnect layers fabricated on the glass before attachment to the silicon wafer can have total lower capacitance and also reduced capacitive coupling between layers than comparable interconnect fabricated after attachment of the silicon wafer to the glass substrate.

The present invention also allows for more layers of metallization. The metal layers are fabricated on the glass substrate, and since planarization processes such as chemical-mechanical polishing are commonly known, many metal layers can be stacked in the buried interconnect with planarized insulating layers in-between. Although only two metallization layers are illustrated in the preferred embodiment described above, additional metallization layers could readily be included. Planarization of insulating layers between metal layers is not a common process in flat-panel backplane fabrication on glass. Alternatively, it may be desirable to have only one buried interconnect layer, in which case the second interconnect layer would not be included. In this case, some global interconnect would likely have to be included above the pixels, or at least formed after bonding of the silicon wafers to the glass substrate.

In a direct digital radiography imaging panel, a scintillating screen is not required. Rather, the photosensing elements are of sufficient thickness that a fraction (about >50%) of the incident X-rays are absorbed in the semiconductor layers in the photosensor, generating large numbers of electron-hole pairs. A sufficient electric field is provided across the photosensor that the electron-hole pairs are spatially separated and drift under the influence of the electric field to separate terminals of the photosensor. Semiconductor materials commonly used for the photosensor in direct radiography include amorphous selenium (a-Se), CdTe, HgI, PbI, etc. The photosensor in direct radiography is, for example, a photoconductor formed with semiconductor material formed in a layer of sufficient thickness that the layer can absorb equal to or greater than 20% of incident X-rays with energies between about 40 KEV and about 90 KEV. Embodiments according to the application can implement a direct radiography imaging array, for example, with a backplane including transistors, an intermediate layer and a frontplane including an amorphous selenium photoconducting material interspersed between pixel electrodes or an optional charge blocking layer. As one of ordinary skill in the art will know, direct X-ray detectors are generally well known in the technical literature.

Moreover, although embodiments have been described in which the readout elements are formed in the same plane as the photosensitive elements, the invention is not limited to such an arrangement. In another embodiment, readout elements could be formed in the thin film silicon, as described above, and photosensitive elements such as amorphous silicon photosensitive elements could be formed on top of the readout elements, using known techniques. Such an arrangement could further increase or maximize fill factor, because only the photosensitive elements would be contained on the upper-most plane of the device.

While the invention has been illustrated with respect to one or more implementations, alterations and/or modifications can be made to the illustrated examples without departing from the spirit and scope of the appended claims. In addition, while a particular feature of the invention can have been disclosed with respect to only one of several implementations, such feature can be combined with one or more other features of the other implementations as can be implemented, desired and/or advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on," "above", "below," etc. nor "over" implies any directionality as used herein. The term "conformal" describes a coating material in which angles of the underlying material are preserved by the conformal material. The term "about" indicates that the value listed can be somewhat altered, as long as the alteration does not result in non-conformance of the process or structure to the illustrated embodiment. Finally, "exemplary" indicates the description is used as an example, rather than implying that it is an ideal. Other embodiments (e.g., implementations) of the invention will be apparent to those skilled in the art from consideration of the specification and practice of the invention disclosed herein. It is intended that the specification and examples be considered as exemplary only, with a true scope and spirit of the invention being indicated by the following claims.

PARTS LIST 10 pixel
12 photodiode
14 transfer gate transistor
16 amplifier transistor
18 reset transistor
20 row select transistor
21 horizontal global interconnect
22 row select line
24 reset gate lines
26 transfer gate line
27 vertical global interconnect
28 data line
30 voltage supply line
32 bias line
100 pixel
102 glass substrate
104 first insulating layer
106 first patterned conductive layer
108 second insulating layer
110 via
112 second patterned conductive layer
114 third insulating layer
116 dielectric layer
118 vias
120 photosensitive element
122 silicon layer
124 N+ doped regions
126 P+ doped regions
128 fourth insulating layer
130 fifth insulating layer
132a, 132b vias
134 third patterned conductive layer
136 fourth patterned conductive layer
140 transistor 151 gate electrode
170 silicon wafer
172 first surface of silicon wafer
174 second surface of silicon wafer
176 separation region
178 thin region of silicon
298 peripheral circuitry
300 vertical addressing circuitry
314 vertical address register stages
318 column amplification and sampling circuitry
320 column amplifiers
322 clamp transistor
324 sample transistor
326 column clamp voltage amplifier
327 column signal voltage amplifier
328 column signal select line
330 horizontal addressing circuitry
332 output amplifier
340 horizontal address register stage
342 clamp clock interconnect line
344 sample gate
352 horizontal signal line for signal voltage
354 horizontal signal line for clamp voltage

The invention claimed is:

1. A method of forming a digital radiographic detector imaging array, comprising:
providing a glass substrate having a top surface;
forming a patterned conductive layer on the top surface of the glass substrate;
forming an insulating layer on the patterned conductive layer, on a side of the patterned conductive layer opposite the glass substrate;
providing more than one single crystal silicon substrates having an internal separation layer proximate a first surface of the single crystal silicon substrate;
securing the first surface of the single crystal silicon substrates to the glass substrate, with the first surface of the single crystal silicon substrates corresponding to the insulating layer;
separating the single crystal silicon substrates at the internal separation layer to create an exposed surface opposite the first surface of the single crystal silicon substrates;
forming, on more than one of the exposed surfaces, an array comprising a plurality of photosensitive elements and readout elements; and
forming, over the arrays, scintillation screens to receive radiation at a first wavelength, and generate visible radiation having a second wavelength.

2. The method of claim 1, comprising forming a base insulating layer between the patterned conductive layer and the top surface of the glass substrate.

3. The method of claim 1, comprising:
forming one or more intermediate interconnect layers between the patterned conductive layer and the insulating layer, each intermediate interconnect layer comprising an additional insulating layer and an additional patterned conductive layer; and
forming one or more vias through one or both of the insulating layer and the additional insulating layer.

4. The method of claim 1, wherein the step of forming the plurality of photosensitive elements comprises forming a plurality of conductive elements on the exposed surface opposite portions of the patterned conductive layer and electrically connecting the conductive elements to the patterned conductive layer.

5. The method of claim 4, wherein the step of electrically connecting comprises forming vias through the insulating layer, wherein the single crystal silicon substrate is doped, wherein the securing step comprises securing the single crystal silicon substrate to the insulating layer using one of frit bonding, soldering, anodic bonding, and an adhesive, and comprising polishing the exposed surface prior to forming the array thereon.

6. The method of claim 1, wherein the step of forming the plurality of photosensitive elements and readout elements comprises forming a pattern in the exposed surface of the single crystal silicon substrate, first portions of the pattern comprising single crystal silicon used in the photosensors and second portions of the pattern comprising single crystal silicon used in the readout elements.

7. The method of claim 1, further comprising electrically connecting at least one of the photosensitive elements and the readout elements to the patterned conductive layer and electrically connecting the at least one of the photosensitive elements to at least one of the readout elements.

8. The method of claim 1, wherein the step of forming the plurality of photosensitive elements and readout elements comprises:
forming a pattern in the exposed surface of the single crystal silicon substrate, first portions of the pattern comprising amorphous silicon photosensors and second portions of the pattern comprising single crystal silicon used in the readout elements,
electrically connecting the amorphous silicon photosensitive elements and the readout elements to the patterned conductive layer and electrically connecting the at least one of the amorphous silicon photosensitive elements to at least one of the readout elements.

9. The method of claim 1, wherein the securing step comprises securing the single crystal silicon substrate to the insulating layer using anodic bonding, and wherein a layer of silicon is formed on the insulating layer to promote anodic bonding.

10. The method of claim 1, further comprising forming a dielectric layer on the first surface of the single crystal silicon substrate before securing the single crystal silicon substrate to the glass substrate.

11. A method of forming a radiographic imaging array, comprising:
providing a glass substrate having a top surface;
forming a first patterned conductive layer over a surface of the glass substrate opposite the top surface of the glass substrate;
forming an intermediate insulating layer on the patterned conductive layer, on a side of the first patterned conductive layer opposite the base insulating layer;
forming a second patterned conductive layer on the intermediate insulating layer, on a side of the intermediate insulating layer opposite the first patterned conductive layer;
forming a top insulating layer on the second patterned conductive layer, on a side of the second patterned conductive layer opposite the intermediate insulating layer;
providing a single crystal silicon substrate having an internal separation layer proximate a first surface of the single crystal silicon substrate;
bonding the single crystal silicon substrate to the glass substrate, the first surface of the single crystal silicon substrate arranged proximate the top insulating layer at a side of the top insulating layer opposite the second patterned conductive layer;

separating the single crystal silicon substrate at the internal separation layer to create an exposed surface opposite the first surface of the single crystal silicon substrate; and forming, on the exposed surface, an array of pixels, each pixel comprising a at least one photosensitive element and at least one readout element.

12. The method of claim 11, comprising forming one or more electrical interconnects between each of the pixels and the first patterned conductive layer, the first patterned layer to be a first global interconnect layer for the pixels.

13. The method of claim 11, comprising:

forming vias through the intermediate insulating layer, to provide an interconnect between the first patterned conductive layer and the second patterned conductive layer, the second patterned layer to be a second global metallization layer for the pixels; and forming at least one local conductive layers within each pixel.

14. The method of claim 11, comprising:

forming a dielectric layer on the first surface of the single crystal silicon substrate before securing the single crystal silicon substrate to the glass substrate; and forming a base insulating layer on the top surface of the glass substrate, wherein the first patterned conductive layer is on the base insulating layer at a side of the base insulating layer opposite the top surface of the glass substrate.

15. The method of claim 11, wherein the step of forming at least one photosensitive element and at least one readout elements comprises:

forming a pattern in the exposed surface of the single crystal silicon substrate, first portions of the pattern comprising amorphous selenium direct photosensors and second portions of the pattern comprising single crystal silicon used in the readout elements, electrically connecting the amorphous selenium direct photosensors and the readout elements to the patterned conductive layer and electrically connecting the amorphous selenium direct photosensors to the readout elements.

16. A radiographic imaging array comprising:

a glass substrate;

a first insulating layer formed on a top surface of the glass substrate;

a first patterned conductive layer formed on the first insulating layer;

a second insulating layer formed on the first patterned conductive layer, on a side of the first patterned conductive layer opposite the first insulating layer;

a dielectric formed on the second insulating layer, on a side of the second insulating layer opposite the first patterned conductive layer;

a patterned single crystal silicon layer having a thickness of less than about 5 microns secured to the second insulating layer, on a side of the second insulating layer opposite the first patterned conductive layer; and an array of pixels including the patterned single crystal silicon layer, each pixel comprising a photosensitive element and a readout element.

17. The imaging array of claim 16, further comprising a second patterned conductive layer between the first patterned conductive layer and the second insulating layer, wherein the first patterned conductive layer comprises interconnect for one of horizontal and vertical connection to the pixels and the second patterned conductive layer comprises interconnect for the other of the horizontal and vertical connection to the pixels.

18. The imaging array of claim 16, further comprising peripheral circuitry disposed at the periphery of the array of pixels, the first patterned conductive layer and the second patterned conductive layer being electrically connected to the peripheral circuitry, wherein the peripheral circuitry is one or more of row address circuitry, column address circuitry, signal sampling circuitry, signal amplification circuitry, voltage conversion circuitry, timing generation circuitry, signal processing circuitry, analog to digital conversion circuitry, electrostatic discharge protection circuitry, and signal interface circuitry, wherein the photosensitive element is one of a p-n junction photodiode, a metal-insulator-semiconductor photo-capacitor, a charge coupled device, a phototransistor, and a pinned photodiode.

19. The imaging array of claim 16, wherein the single crystal silicon layer is formed by separating a single crystal silicon substrate at an internal separation layer.

20. The imaging array of claim 19, further comprising a silicon layer between the first insulating layer and the glass substrate, the silicon layer being attached by anodic bonding to the glass substrate, wherein the photosensitive element is formed of amorphous silicon or the photosensitive element is formed in the single crystal silicon layer.

* * * * *

UNITED STATES PATENT AND TRADEMARK OFFICE
CERTIFICATE OF CORRECTION

| | | |
|---|---|---|
| PATENT NO. | : 8,405,036 B2 | Page 1 of 1 |
| APPLICATION NO. | : 12/862204 | |
| DATED | : March 26, 2013 | |
| INVENTOR(S) | : Timothy J. Tredwell | |

It is certified that error appears in the above-identified patent and that said Letters Patent is hereby corrected as shown below:

In the Specification

Column 8, Line 58     Please replace the word "O," with the word --O.--

Column 9, Line 6     Please replace the word "fit" with the word --frit--

Column 9, Line 14     Please replace the word "fit" with the word --frit--

Signed and Sealed this
Eleventh Day of March, 2014

Michelle K. Lee
*Deputy Director of the United States Patent and Trademark Office*